United States Patent [19]

Takase et al.

[11] Patent Number: 4,979,089

[45] Date of Patent: Dec. 18, 1990

[54] METHOD FOR BALANCING CURRENTS TO SWITCHING DEVICES

[75] Inventors: Shinichi Takase, Ebina; Masayuki Ishii, Yokohama, both of Japan

[73] Assignee: Neturen Company Limited, Tokyo, Japan

[21] Appl. No.: 357,272

[22] Filed: May 26, 1989

[51] Int. Cl.[5] .................. H02M 7/5387; H02H 7/122

[52] U.S. Cl. .................................. 363/132; 363/58; 361/392; 361/393; 361/400

[58] Field of Search ...................... 363/17, 55, 58, 98, 363/132, 147; 361/392, 393, 395, 400, 404

[56] References Cited

U.S. PATENT DOCUMENTS 4,670,833 6/1987 Sachs ............................ 363/147 X

OTHER PUBLICATIONS

Modern Technology Series; "Power Electronics"; Kouji Imai; Denki Shoin Co., Ltd., 1977, pp. 2-9 and 62-63.

*Primary Examiner*—Steven L. Stephan

*Assistant Examiner*—Emanuel Todd Voeltz

*Attorney, Agent, or Firm*—Wenderoth, Lind & Ponack

[57] ABSTRACT

A method is provided for balancing a current distribution to a plurality of switching device of full-bridge inverter composed of N modules. Each of the N modules includes series connected first and second switching devices. The N modules are arranged in a row. First and second supply feeder bars for connection to a dc power source are provided along one side of the row of N modules, and first and second load feeder bars are provided on the opposite side of the row of N modules for connection to a load. Each of the N modules is selectively connected to one of the first and second load feeder bars and to one of the first and second supply feeder bars such that a current flow direction of each module is the same as the a current flow direction of one adjacent module and is opposite a current flow direction of the other adjacent module. Furthermore, the dc power source is connected to the first and second supply feeder bars at one end of the row of modules, and the load is connected to the load feeder bars at the other end of the row of modules.

4 Claims, 4 Drawing Sheets

A
B
C
D
Lo
Sa1
Sa2
Sa3
Sb1
Sb2
Sb3
Sc1
Sc2
Sc3
Sd1
Sd2
Sd3
+
-

SB⊖
SB⊕
Lo
OB1
OB2
MA1
MA2
MA3
MA4
MD1
MD2
MD3
MD4
Sa1
Sa2
Sa3
Sa4
Sd1
Sd2
Sd3
Sd4
id1
id2
id3
id4
ia1
ia2
ia3
ia4

SB1⊕
SB1⊖
SB⊖
SB⊕
SB2⊕
SB2⊖
MD6
MA6
MA4
MD4
MD2
MA2
MD5
MA5
MA3
MD3
MD1
MA1
Sc6
Sd6
Sa6
Sb6
Sa4
Sb4
Sc4
Sd4
Sc2
Sd2
Sa2
Sb2
Sd5
Sc5
Sb5
Sa5
Sb3
Sa3
Sd3
Sc3
Sd1
Sc1
Sb1
Sa1
OB1
OB2
Lo

METHOD FOR BALANCING CURRENTS TO SWITCHING DEVICES

BACKGROUND OF THE INVENTION

1. Field of the Invention.

The present invention relates to a method for balancing the current distribution to a plurality of switching devices of a full-bridge inverter, such as a power supply for induction heating used in hardening or tempering members. The full-bridge inverter has each arm equipped with a plurality of parallel connected switching devices and is composed of two bridge portions comprising a plurality of module-type circuits. That is, the integrated modules with corresponding switching devices in both arms form a half bridge and are connected to each other.

2. Description of the Prior Art.

Inverters may include a plurality of parallel connected switching devices in each arm in order to increase output power.

In such an arrangement, a method has been available in which an equidistant, or mechanically symmetrical, arrangement is provided to obtain a constant wiring inductance to the load via each switching device from a DC power supply to thereby secure a balance of currents supplied to each switching device.

For instance, a book entitled "Power Electronics" by Fouji Imai, published by DENKI SHOIN CO., LTD. in 1977 illustrates an equidistant wiring arrangement in FIG. 2.33 at Page 63 of SECTION 2.5.2 "Parallel Connection".

There are increased demands for relatively small output full-bridge inverters in which each arm includes a single switching device.

Modules which integrate two series connected switching devices to obtain a half-bridge inverter are marketed at a low cost in great quantities due to their convenient usage.

In attempting to form a half-bridge inverter using such inexpensive modules connected in parallel to obtain a greater output level at a low cost, extreme difficulties will arise in creating the equidistant wiring or mechanically symmetrical arrangement due to the configuration of the integrated modules, resulting in a possible imbalance of current distribution.

FIG. 1 is a basic circuit diagram of a full-bridge inverter in which transistors are used as the switching devices.

As shown in FIG. 1, A to D denote the arms of the full bridge inverter connected to load Lo, Sa1 to Sa3 denote the parallel connected switching devices comprising arm A, Sb1 to Sb3 denote parallel connected switching devices comprising arm B, Sc1 to Sc3 denote the parallel connected switching device of arm C, and Sd1 to Sd3 denote the parallel connected switching devices comprising arm D.

Inverters as showing FIG. 1, as is known to the art, are capable of having input thereto a DC current from a power supply and outputting an AC current to load Lo by alternation of simultaneous conductions of switching devices Sa1 to Sa3 in arm A and switching devices Sd1 to Sd3 in arm D, and simultaneous conductions of switching devices Sc1 to Sc3 in arm C and switching devices Sb1 to Sb3 in ar B.

FIG. 4 illustrates a conventional arrangement in which a plurality of modules, each having two integrated series connected switching devices, for example Sa1 and Sb1, are connected to feed bars and output bars.

In FIG. 4, SB+ and SB− denote positive and negative terminal feed bars respectively connected to a DC power source (not shown), OB1 and OB2 denote output bars connected to load Lo, MA1 to MA3 denote the modules forming one half-bridge of the inverter and MD1 to MD3 denote the modules forming another half-bridge of the inverter.

The connecting arrangements of FIG. 4 of the modules is intended to realize the equidistance requirements at least as closely as possible by inverting the DC power source side of the feed bars and the load Lo side of output bars, and by arranging symmetrically the MA side and the MD side.

However, it has become clear during studies made in finalizing the present invention that the arrangement of FIG. 4 does not provide a balanced conduction of the current through each switching device.

The above-noted conduction of current imbalance will be appreciated by the following description. Reference is first made to switching device Sa1. The loops formed by current ia1 flowing through switching device Sa1 include loop MA1–MD1, consisting of SB+→Sa1→OB1→Lo→OB2→Sd1→SB−, and another two loops sharing the same outgoing path but having different return paths out of load Lo, i.e. loops MA1→MD3 via Sd2 and MA1→MD3 via Sd3.

The wiring inductances of these loops are discussed below, except for the line inductance of the circuit because the modules are arranged equidistance to each other and each loop requires both the circuit between the power source and each module and the circuit between each module and the load Lo.

Wiring inductances L of each loop are:

MA1–MD1—1L

MA1–MD2—2L

MA1–MD3—3L where L is a wiring inductance between each module with the arranged position of switching device Sa1 included in module MA1 as reference.

The current tends to flow along the route of the smallest current-conducted area as wiring inductance L varies proportionally with current-conducted area. Accordingly, the relative values of currents ia1→d1, ia1→d2 and ia1→d3 flowing in a loop to MD1, MD2 and MD3 via MA1 are:

$$ia1 \rightarrow d1 = 1$$

$$ia1 \rightarrow d2 = \tfrac{1}{2}$$

$$ia1 \rightarrow d3 = \tfrac{1}{3}$$

where the value of current ia1→d1 is 1.

Similarly, wiring inductances L of the loop formed with switching device Sa2 included in MA2, and the loop formed with switching device Sa2 included in MA2, and the loop formed with switching device Sa3 included in MA3, together with the case of MA1 with loop MA1–MD1 as the base position, and relative current values flowing each loop when the value of current ia1→d1 is 1, are given in TABLE 1.

TABLE 1

| Loops formed | | Wiring inductances of each loop as MA1 − MD1 = 1L | Current values flowing through each loop as ia1 → d1 = 1 |
|---|---|---|---|
| Reference modules | Modules on return side | | |
| MA1 | MD1 | 1L | ia1 → d1 = 1 |
| | MD2 | 2L | ia1 → d2 = ½ |
| | MD3 | 3L | ia1 → d3 = ⅓ |
| MA2 | MD1 | 2L | ia2 → d1 = ½ |
| | MD2 | 3L | ia2 → d2 = ⅓ |
| | MD3 | 4L | ia2 → d3 = ¼ |
| MA3 | MD1 | 3L | ia3 → d1 = ⅓ |
| | MD2 | 4L | ia3 → d2 = ¼ |
| | MD3 | 5L | ia3 → d3 = 1/5 |

The sum totals of current values flowing through each switching device included in modules MD1 to MD3 on the return path, i.e. Sd1, Sd2 and Sd3, are:

Sd1; $1+\frac{1}{2}+\frac{1}{3}\cong 1.83$

Sd2; $\frac{1}{2}+\frac{1}{3}+\frac{1}{4}\cong 1.08$

Sd3; $\frac{1}{3}+\frac{1}{4}+1/5\cong 0.75$, resulting in significant differences (as high as 41%) in the current distributions and in concentrated currents flowing inside module MD1 as seen from the Table 1.

The above calculation is also applicable to the loop resulting where model MA1 to MA3 is made a return path, i.e. the loop with switching devices Sc1 to Sc3 as the return path, and the more the number of modules there are, the more intensive the concentration of current becomes in the innermost switching device due to the summation of tiny differences in the wiring inductance L produced in each loop, resulting in a large inbalance in the current distribution.

Inbalance in current distribution may cause open-circuit or short-circuit faults due to overload of switching device to which the current is concentrated.

For instance, if a switching device is open-circuited the other switching devices in the same arm will take over for the failed device and maintain the output power so that the inverter is kept running without notice of the fault. Then, once one switching device fails, the other switching devices in the arm become overloaded, resulting in a chain reaction of troubles.

A short-circuited switching device may make the inverter operation instable, and if the inverter is kept running without notice of the fault, the circuit of the failed device will be broken due to overheating, thus triggering a chain reaction of troubles in the other switching devices in the arm similar to the above open-circuit fault situation. Thus, the conventional method has not been capable of avoiding the spread of damages due to a single faulty device, regardless of whether the fault is a open-circuit or a short-circuit.

OBJECT OF THE INVENTION

It is an object of the present invention to equalize the balance of the current distribution to each switching device of a full-bridge inverter having each arm comprising a plurality of parallel connected switching devices, in which each half-bridge of the full-bridge inverter is composed of a plurality of modules.

It is another object of the invention to avoid the failure of a certain switching device in the arm due to the overload of the device in a particular connected position.

It is still another object of the invention to prevent a chain reaction of troubles in the switching devices of an arm due to an overload of the other switching devices taking over for a single faulty device.

It is a further object of the invention to reduce the manufacturing cost of the inverter by allowing the heavy duty inverter to use a number of inexpensive small current modules which are marketed in great quantities.

The other features and advantages of the present invention will become apparent from the following description with reference to the accompanying drawings.

DETAILED DESCRIPTION OF THE INVENTION

The method of balancing the current distribution to a plurality of switching devices according to the present invention is summarized as follows:

(1) the feed bars of the power supply side and the output bars of the load side are opposed;

(2) a plurality of module-type circuits are connected to the feed bar and output bar, and the relative lengths of the circuit to the power supply and the load become increasingly smaller from the opposite ends toward the center and;

(3) except for the extreme outside modules, the direction of the current flowing through a module is opposite to one neighboring module and the same as another neighboring module.

Figure 1:
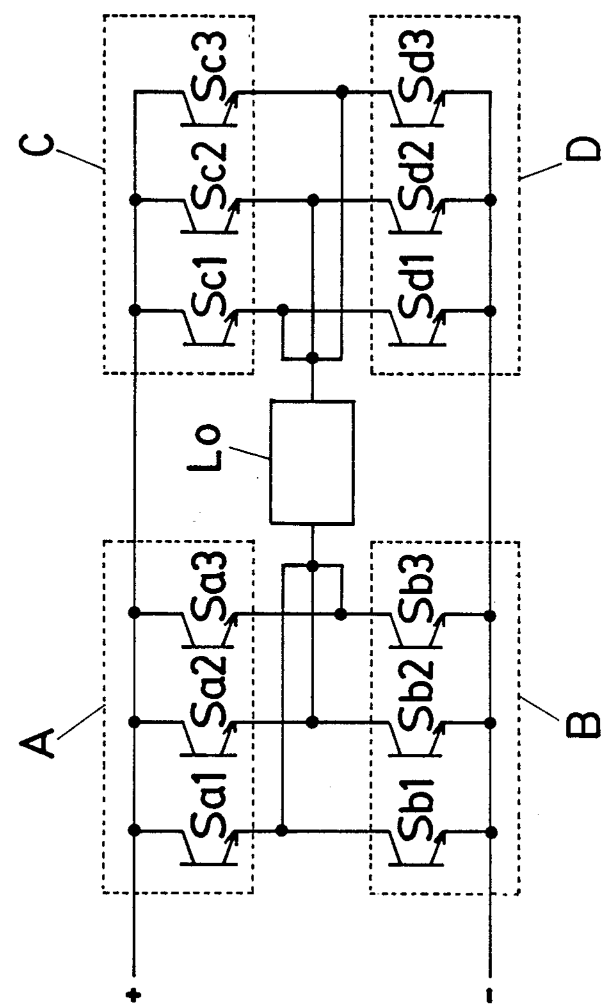
FIG. 1 is a basic schematic representation of an embodiment of a full-bridge inverter in relation to the present invention.
Figure 2:
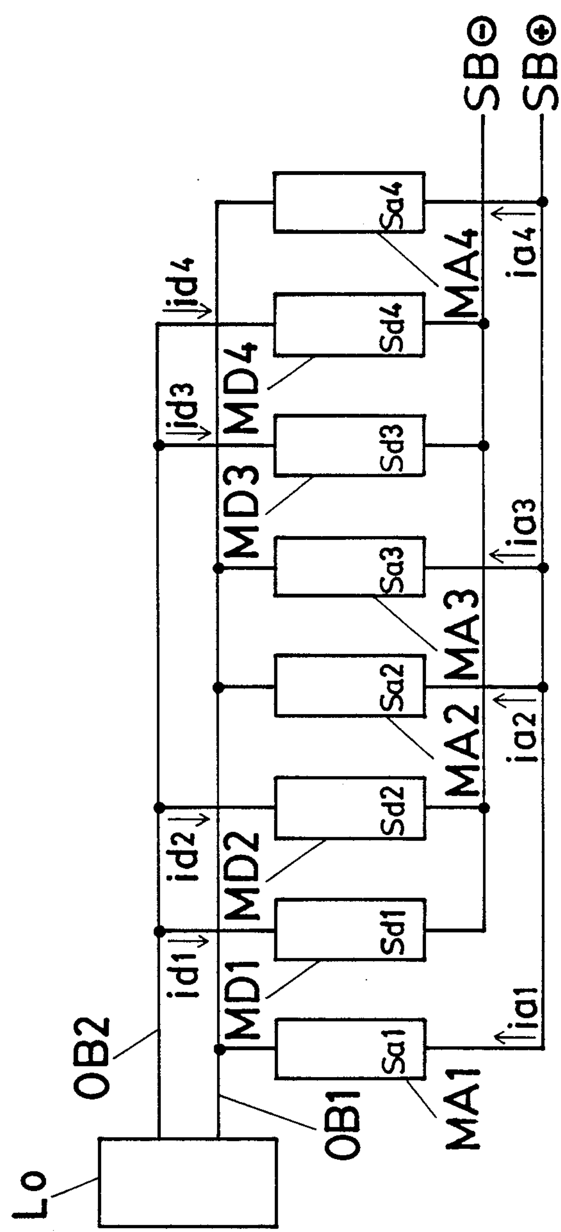
FIG. 2 is a circuit diagram of a module arrangement representing an embodiment of the present invention in which a one-way current circuit is depicted.

The present invention is described below in detail with reference to an embodiment shown in FIG. 2. FIG. 2 depicts a one-way current circuit only to provide a clear understanding of the principle of the present invention and to avoid the complexity of illustrating a two-way current circuit.

In FIG. 2, SB+ and SB− denote positive and negative terminal feed bars respectively, OB1 and OB2 denote output bars, Lo denotes the load, and MA1 to MA4 and MD1 to MD4 denote modules.

According to the present invention, as illustrated in FIG. 2, modules are arranged as to satisfy the above requirements (1) through (3) and are connected to feed bars SB+, SB− and to output bars OB1, OB2.

A more detailed description of these requirements with respect to each module follows.

Modules MA1 and MA4 have the largest relative connecting lengths to the supply source and to the load Lo, respectively, among the eight modules. Modules MD1 and MD4 have smaller connecting lengths than the above MA1 and MA4, whereas MD1 has an opposite current direction than neighboring MA1 and the same current direction as MD2. On the other hand, MD 4 has an opposite current direction than neighboring MA4 and the same current direction as MD3, thereby meeting the above requires (2) and (3).

MD2 and MD3 have smaller connecting lengths than MD1 and MD4. MD2 has the same current direction as neighboring MD1 and has an opposite direction than MA2. MD3 has the same current direction as neighboring MD4 and has an opposite direction than MA3, thereby meeting the above requirements (2) and (3).

Modules MA2 and MA3 have smaller connecting lengths MD2 and MD3. MA2 has an opposite current direction than neighboring MD2 and has the same direction as MA3. MA3 has the same current direction as neighboring MA2 and has an opposite current direction than MD3, thereby satisfying the above requirements (2) and (3).

The module connections of the present invention may seem clumsy at first impression. However, it is actually clearcut that the arrangement forms two half bridges, i.e. one half-bridge with modules MA1 to MA4 and another with modules MD1 to MD4.

The distribution of the current supplied to each switching device included in each module arranged accordingly are described below with reference to the equidistant arrangement of each module and the line inductance L for each spacing, while omitting reference to the line inductance to the supply source and to the load Lo similar to the above conventional method.

Wiring inductances of each loop formed by current iai flowing through switching device Sa1 included in module MA1 are:

MA1-MD1—1L
MA1-MD2—2L
MA1-MD3—5L
MA1-MD4—6L

The wiring inductance is proportion to the current conduction area as described above so that the current conducts through the smaller conduction area route. Thus, the relative current values flowing through each loop are:

$$ia1-d1=1$$

$$ia1-d2=\frac{1}{2}$$

$$ia1-d3=1/5$$

$$ia1-d4=1/6$$

where the value of current ial dl flowing to MD1 via MA1 is 1.

Table 2 shows the values of the current flowing through loops as formed with switching device Sa2 included in module MA2, as formed with switching device Sa3 included in module MA3, and as formed with switching device Sa4 included in module MA4, together with the above case of module MA1, when each wiring inductance is 1L and current ia1→d1 is 1 with loop MA1-MD1 as the base position.

TABLE 2

| Loops formed: Reference modules | Loops formed: Module on return side | Wiring inductances of each loop as MA1 − MD1 = 1L | Current values flowing through each loop as ia1 → d1 = 1 |
|---|---|---|---|
| MA1 | MD1 | 1L | ia1 → d1 = 1 |
| | MD2 | 2L | ia1 → d2 = ½ |
| | MD3 | 5L | ia1 → d3 = 1/5 |
| | MD4 | 6L | ia1 → d4 = 1/6 |
| MA2 | MD1 | 2L | ia2 → d1 = ½ |
| | MD2 | 1L | ia2 → d2 = 1 |
| | MD3 | 2L | ia2 → d3 = ½ |
| | MD4 | 3L | ia2 → d4 = ⅓ |

TABLE 2-continued

| Loops formed: Reference modules | Loops formed: Module on return side | Wiring inductances of each loop as MA1 − MD1 = 1L | Current values flowing through each loop as ia1 → d1 = 1 |
|---|---|---|---|
| MA3 | MD1 | 3L | ia3 → d1 = ⅓ |
| | MD2 | 2L | ia3 → d2 = ½ |
| | MD3 | 1L | ia3 → d3 = 1 |
| | MD4 | 2L | ia3 → d4 = ½ |
| MA4 | MD1 | 6L | ia4 → d1 = 1/6 |
| | MD2 | 5L | ia4 → d2 = 1/5 |
| | MD3 | 2L | ia4 → d3 = ½ |
| | MD4 | 1L | ia4 → d4 = 1 |

The sum total of the relative current values flowing through the switching devices of modules MD1 to MD4 on the return path, i.e., Sd1 to Sd4, are:

$$Sd1;\ 1+\frac{1}{2}+\frac{1}{3}+1/6=2.00$$

$$Sd2;\ \frac{1}{2}+1+\frac{1}{2}+1/5=2.20$$

$$Sd3;\ 1/5+\frac{1}{2}+1+\frac{1}{2}=2.20$$

$$Sd4;\ 1/6+\frac{1}{3}+\frac{1}{2}+1=2.00$$

The differences of the distribution of the present embodiment are as little as about 10 percents, far less than the conventional method. The same situation results with switching devices Sb to SB4 of modules MA1 to MA4 on the return path (not illustrated).

The present invention is also applicable where each arm comprises more switching devices than the above embodiment so long as the connections of each module are such that the above requirements are met.

Figure 3:
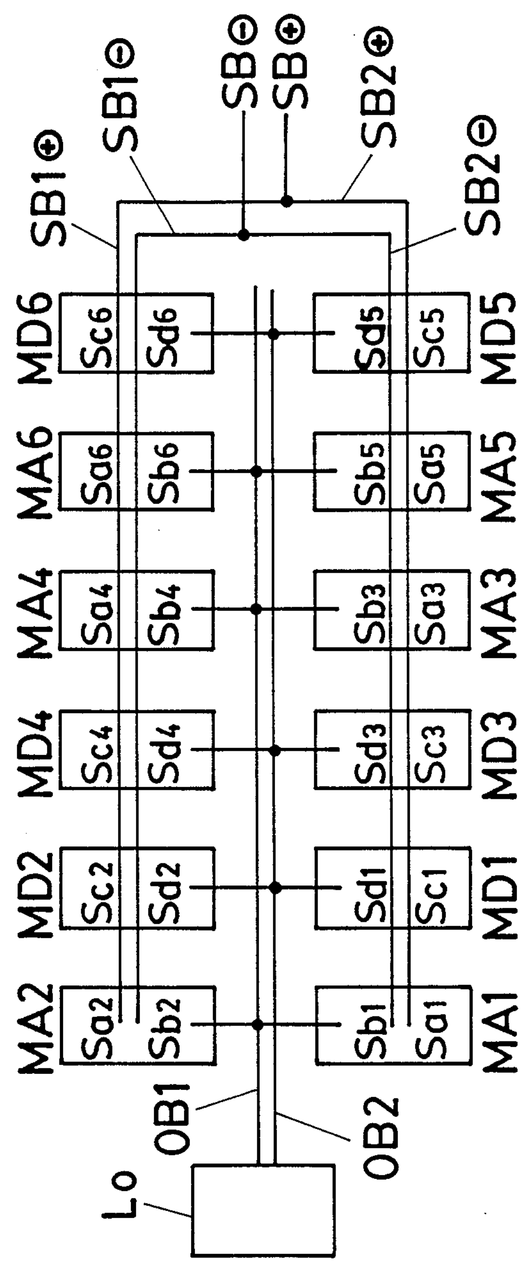
FIG. 3 is a circuit diagram of a module arrangement in an application of the present invention.
Figure 4:
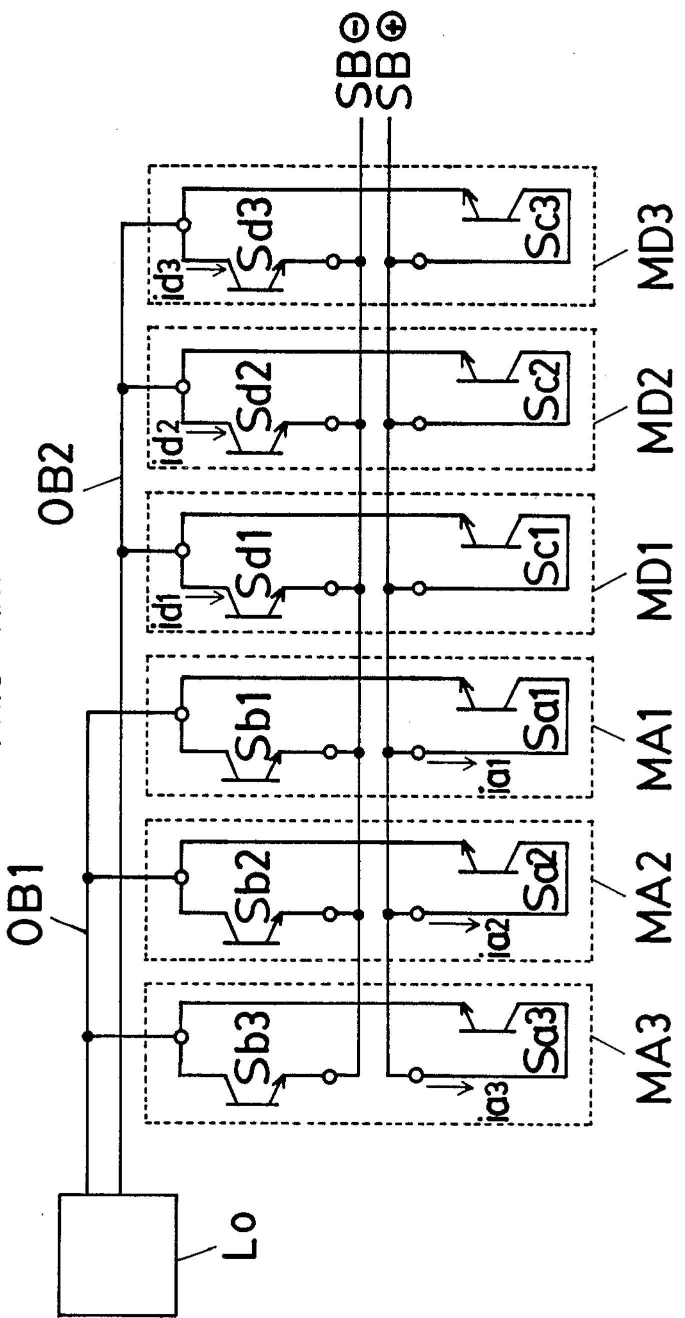
FIG. 4 is a circuit diagram of a module arrangement according to the conventional method.

FIG. 3 shows an arrangement for employment of many more modules. The figure represents the case where twelve modules MA1 to MD 6 are to used to form one half-bridge comprising modules MA1 to MA6 and another half-bridge comprising MD1 to MD6. In the figure, SB1+, SB2+ denote positive terminal feed bars branched out from SB+, SB− and SB2− denote negative terminal feed bars branched out from SB− and OB1 and OB2 denote output bars. In order to meet the above requirements (1) through (3), requirement (1) is satisfied by positioning the supply source side of the feed bar and the load side of the output bar opposed to each other. A number of modules n is divided into two groups, each arranged on output bars OB1, OB2, and the n/2 modules belonging to one group are connected to supply bar SB1+ and to supply bar SB1− to output bar OB1 and to OB2. The n/2 modules belonging to another group are connected to supply bar SB2+ and supply bar SB2− to output bars OB1 and OB2 in such a way so that both groups satisfy the requirement (2) by having successively smaller relative connecting lengths to the supply source and load Lo from the opposite ends toward the center similar to the above description of FIG. 2, and also satisfy the requirement (3) in that the current direction of each module is opposite one neighboring module in the same as another neighboring module, except for the outermost modules.

As described above, the method for balancing the current distribution to switching devices of the present invention permits equalization so far as possible when each arm comprises a plurality of switching devices connected in parallel of the full-bridge inverter and each half-bridge comprises a plurality of module-type circuits.

Thus, application of the present invention provides uniform current flowing through each switching device, thereby helping to eliminate faults in the arm due to overload of a particular switching device. Therefore, successive troubles due to sequential overload of other switching devices in the arm by the fault of a single overloaded devices is reliably avoided, enabling the inverter to operate in a stable manner for long period of time.

The present invention is further applicable for use in heavy duty applications requiring inexpensive small power modules, thereby resulting in a great reduction in manufacturing cost of the inverter and many other benefits of the present invention.

We claim:

1. A method for balancing a current distribution to a plurality of switching devices of a full-bridge inverter composed of N modules, N being an even positive number, each of the N modules including series connected first and second switching devices and first and second terminals respectively connected to the first and second switching devices, said method comprising the steps of:

arranging the N modules in a row extending from a first end to a second end;

providing first and second supply feeder bars along one side of the row of N modules, the first supply feeder bar for connecting to a first terminal of a dc power source, and the second supply feeder bar for connecting to a second terminal of the dc power source;

providing first and second load feeder bars along an opposite side of the row of N modules relative the first and second supply feeder bars, the first load feeder bar for connecting to a first terminal of a load, and the second load feeder bar for connecting to a second terminal of the load;

connecting the first terminal of each of the N modules to one of the first and second load feeder bars, and connecting the second terminal of each of the N modules to one of the first and second supply feeder bars, such that a current flow direction for each of the N modules, other than the modules arranged at the first and second ends of the row, is the same as a current flow direction of one adjacent module and is opposite a current flow direction of the other adjacent module.

2. A method as recited in claim 1, further comprising the steps of:

connecting the load to the first and second load feeder bars at the first end of the row; and, connecting the dc power source to the first and second supply feeder bars at the second end of the row.

3. A method for balancing a current distribution to a plurality of switching devices of a full-bridge inverter composed of N modules, N being an even positive number, each of the N modules including series connected first and second switching devices and first and second terminals respectively connected to the first and second switching devices, said method comprising the steps of:

arranging the N modules into adjacent first and second rows of N/2 modules extending from a first end to a second end;

providing first and second supply feeder bars along the first row of N/2 modules and third and fourth supply feeder bars along the second row of N/2 modules, the first and third supply feeder bars for connecting to a first terminal of a dc power source and the second and fourth supply feeder bars for connecting to a second terminal of the dc power source;

providing first and second load feeder bars between the first and second rows of N/2 modules, the first load feeder bar for connecting to a first terminal of a load, and the second load feeder bar for connecting to a second terminal of the load;

connecting the first terminal of each of the N/2 modules of the first row to one of the first and second load feeder bars, and the second terminal of each of the N/2 modules of the first row to one of the first and second supply feeder bars, such that a current flow direction for each of the N/2 modules of the first row, other than the modules arranged at the first and second ends of the first row, is the same as a current flow direction of one adjacent module and is opposite a current flow direction of the other adjacent module;

connecting the first terminal of each of the N/2 modules of the second row to one of the first and second load feeder bars, and connecting the second terminal of each of the N/2 modules of the second row to one of the third and fourth supply feeder bars, such that a current flow direction for each of the N/2 modules of the second row, other than the modules arranged at the first and second ends of the second row, is the same as a current flow direction of one adjacent module and is opposite a current flow direction of the other adjacent module.

4. A method as recited in claim 3, further comprising the steps of:

connecting the load to the first and second load feeder bars at the first end of the row; and, connecting the dc power source to the first through fourth supply feeder bars at the second end of the row.

* * * * *